(12) United States Patent
Allworth et al.

(10) Patent No.: US 6,486,820 B1
(45) Date of Patent: Nov. 26, 2002

(54) PIPELINE ANALOG-TO-DIGITAL CONVERTER WITH COMMON MODE FOLLOWING REFERENCE GENERATOR

(75) Inventors: Peter C. Allworth, Wollstonecraft (AU); Rodney J. Chandler, Marsfield (AU); Jeffrey N. Harrison, Eastwood (AU)

(73) Assignee: Cisco Systems Wireless Networking (Australia) Pty Limited, North Sydney (AU)

( * ) Notice: Subject to any disclaimer, the term of this patent is extended or adjusted under 35 U.S.C. 154(b) by 0 days.

(21) Appl. No.: 09/930,091

(22) Filed: Aug. 15, 2001

Related U.S. Application Data

(60) Provisional application No. 60/277,370, filed on Mar. 19, 2001, and provisional application No. 60/283,609, filed on Apr. 13, 2001.

(51) Int. Cl.[7] .................................................. H03M 1/42
(52) U.S. Cl. ...................................... 341/161; 341/155
(58) Field of Search .............................. 341/161, 155, 341/162, 163

(56) References Cited

U.S. PATENT DOCUMENTS

| | | | |
|---|---|---|---|
| 4,918,399 A | 4/1990 | Devecchi et al. | 330/253 |
| 5,294,893 A | 3/1994 | Ryat | 330/258 |
| 5,499,027 A | 3/1996 | Karanicolas et al. | 341/120 |
| 5,594,445 A | 1/1997 | Ginetti | 341/162 |
| 5,844,442 A | 12/1998 | Brehmer | 330/258 |
| 5,847,607 A | 12/1998 | Lewicki et al. | 330/258 |
| 5,861,832 A | 1/1999 | Nagaraj | 341/161 |
| 5,880,690 A * | 3/1999 | Rothenberg | 341/161 |
| 5,929,796 A | 7/1999 | Opris et al. | 341/120 |
| 6,028,546 A | 2/2000 | Signell et al. | 341/161 |
| 6,034,568 A | 3/2000 | Bonaccio et al. | 330/253 |
| 6,091,350 A | 7/2000 | Paulos et al. | 341/139 |
| 6,208,206 B1 | 3/2001 | Leung et al. | 330/107 |

OTHER PUBLICATIONS

John W. Fattaruso, Opamp Compensation for Low–Voltage, Mixed–Signal Designs Tutorial IEEE International Solid–State Circuits Conference ISSCC98, San Francisco, CA, Feb. 1998.

Fan You, Sherif H. K. Embabi and Edgar Sanchez–Sinencio, "Multistage Amplifier Topologies with Nested $G_m$–C Compensation," IEEE Journal of Solid–State Circuits, vol. 32, No. 12, pp. 2000–2011, Dec. 1997.

Yong–In Park, S. Karthikeyan, Frank Tsay and Eduardo Bartolome, "A low power 10 bit, 80 MS/s CMOS pipelined ADC at 1.8V power supply," Paper 1590, Proceedings ISCAS2001, IEEE International Symposium on Circuits and Systems May 6–9, 2001, Sydney, Australia.

(List continued on next page.)

*Primary Examiner*—Brian Young
(74) *Attorney, Agent, or Firm*—Dov Rosenfeld; Inventek

(57) ABSTRACT

A pipeline analog-to-digital converter (ADC) includes cascaded stages for resolving at least one bit of an analog voltage. Each stage has an analog input, one or more reference voltage inputs, and one or more digital outputs. The analog voltage is coupled to the analog input of the first stage. Each stage but the last has an analog output connected to the analog input of the next stage, and includes an operational amplifier that has one or more differential amplifiers having a common mode voltage. The pipeline ADC includes a reference generator to generate the one or more reference voltages for the stages. The reference generator includes a circuit to track the common mode voltage of the differential amplifiers such that the generated reference voltages are relative the common mode voltages of the differential amplifiers.

19 Claims, 8 Drawing Sheets

OTHER PUBLICATIONS

Shouli Yan, Edgar Sanchez–Sinencio, "Low Voltage Analog Circuit Techniques: A Tutorial, " IEICE Trans. Analog Integrated Circuits and Systems, vol. E00–A, No. 2, pp. 1–17, Feb. 2000.

K.N. Leung, P.K.T. Mok, W.H. Ki, and J.K.O. Sin, "Damping–Factor Control Frequency Compensation Technique for Low–Voltage Low–Power Large Capacitive Load Applications", *IEEE International Solid–State Circuits Conference*, San Francisco, CA, pp. 158–159, 1999.

X. Xie, M.C. Schneider, E. Sanchez–Sinencio, and S.H.K. Embabi, "Sound Design of low power nested transconductance–capacitance compensation amplifiers", Electronics Letters,. vol. 35, No. 12, pp. 956–958, Jun. 1999.

M. Waltari, K. Halonen, "8–bit Low–Voltage Pipelined ADC Utilizing Switched–Opamp Technique," in *proc 25th European Solid–State Circuits Conference*, pp. 174–177, Sep. 1999.

Jeffrey Harrison: "Opamps with local common–mode feedback," Technical Report, Department of Electronics, Macquarie University, Marsfield, NSW, Australia, *http://www.elec.mq.edu.au/~jnharris/opampreport.ps*.

\* cited by examiner

PIPELINE ANALOG-TO-DIGITAL CONVERTER WITH COMMON MODE FOLLOWING REFERENCE GENERATOR

RELATED PATENT APPLICATIONS

This application claims benefit of two U.S. provisional patent applications. The first is U.S. Provisional Patent Application Ser. No. 60/277,370 entitled SYSTEM USING SINGLE CHIP WIRELESS LAN MODEM AND SINGLE CHIP RADIO TRANSCEIVER AND APPARATI, METHODS, AND SOFTWARE PRODUCTS USED THEREIN OR THEREWITH, filed: Mar. 19, 2001, (the "First Parent Application"). The second is U.S. Provisional Patent Application Ser. No. 60/283,609 entitled WIRELESS COMMUNICATION SYSTEM, filed: Apr. 13, 2001, (the "Second Parent Application"). Such provisional patent applications are incorporated herein by reference.

This invention also is related to concurrently filed U.S. patent application Ser. No. 09/930,388 entitled MULTI-STAGE OPERATIONAL AMPLIFIER FOR INTER-STAGE AMPLIFICATION IN A PIPELINE ANALOG-TO-DIGITAL CONVERTER, inventors Chandler, et al., filed: Aug. 15, 2001.

BACKGROUND

This invention is related to analog-to-digital converters, and in particular to low-voltage low-power pipeline analog-to-digital converters and to interstage amplifiers therefor.

Analog-to-digital converters (ADCs) with pipeline architecture are well suited for low-power, high-speed applications, for example for inclusion in integrated circuits such as CMOS integrated circuits. Advantages of the pipeline architecture over other architectures for high-speed applications include small die-area and low-complexity. CMOS technology is well established and offers the advantages of high levels of integration and low fabrication costs. CMOS can be used for both analog and digital functions, often on the same device.

Designing such pipeline ADCs for very low power and deep sub-micron CMOS digital processes is a challenge due mostly to reduced dynamic range and low supply voltage, e.g. 2.5V, while maintaining signal-to-noise ratio (SNR) and signal-to-noise and distortion ratio (SINAD). For example, with low supply voltage, the threshold voltages of the MOS devices used in analog circuits such as amplifiers used in a pipeline ADC can constrain the designs.

FIG. 1 shows a block diagram for a typical pipeline ADC 100. While ADC 100 of FIG. 1 is labeled prior art, a pipeline ADC conforming to the architecture of FIG. 1 and having one or more features of the invention described herein may not be prior art. Pipeline ADC 100 produces an N-bit number $B_{N-1} \ldots B_1, B_0$ and comprises a number, say K, of stages, shown numbered (K–1), (K–2), . . . 1, 0 in FIG. 1, with each stage responsible for resolving one or more bits. Each stage need not be identical. For example, each stage may be responsible for resolving a different number of bits. For simplicity, all stages but the last are assumed identical. Each stage produces a digital output and an analog residue output. The digital outputs of stages (K–1), (K–2), . . . , 1, 0 are respectively labeled $P_{K-1}, P_{K-2}, \ldots, P_1, P_0$ in FIG. 1 The stages may all produce a digital output with the same number of bits, or a digital output with an unequal number of bits. The digital output $P_{K-1}, P_{K-2}, \ldots, P_1, P_0$ are input to a code converter to produce the N-bit output $B_{N-1}, \ldots, B_1, B_0$. The analog residue signal produced by each stage but the last is input to the next stage.

One example is a "1.5-bit" per stage converter. One bit is resolved at each stage, with the resulting analog residue passed along to the next stage for resolution of another bit. The digital output in such an example, the final stage might be a two-bit flash ADC that resolves the two least significant bits. In one example, such an architecture includes N–2 stages and one two-bit ADC for the final stage for an N-bit converter. The code output by each stage may a three value output (e.g., a signal having value of –1, 0, or +1) or two binary output signals, called the full bit and half bit outputs.

FIG. 2 shows one architecture for an intermediate stage, say the M'th stage 200 of ADC 100. While ADC 200 of FIG. 1 is labeled prior art, a pipeline ADC conforming to the architecture of FIG. 2 and having the features of the invention described herein may not be prior art. ADC 200 includes a sample and hold (S/H) circuit 203 to sample the residue from the previous stage, an analog-to-digital converter (ADC) 205 that determines the digital code $P_M$ for this stage, a digital-to-analog converter (DAC) 207 that produces an analog equivalent of $P_M$, denoted $V_{DAC}(M)$, and a summing interstage amplifier 209 that subtracts the analog equivalent $V_{DAC}(M)$ from the sampled previous-stage residue to produce the residue $V_{RES}(M)$ that is fed to the next stage. In general, summing interstage amplifier 209 also multiplies the difference by a factor of $2^J$, where J is the integer part of the number of bits resolved at each stage. For a 1.5 bit stage of an N-bit converter with a 2-bit flash converter as the last stage, J is 1, so that the interstage amplifier outputs $$V_{RES}(M)=2(V_{RES}(M)-V_{DAC}(M))$$

for M=N–1, . . . , 2.

The interstage amplifier 209 may be implemented by a switched capacitor circuit that includes a fully differential operational amplifier. One such switched capacitor circuit incorporates the sample and hold for the next stage, so that a separate sample and hold circuit 205 is not necessary except for the first stage.

For relatively high speed and low settling time operation, the operational amplifier needs to have a very high gain-bandwidth product. One mechanism for achieving high gain is a vertical gain enhancing technique such as cascading. Cascoding, however, is relatively unsuitable for low voltage operation because, for example, threshold voltages are a significant fraction of the process supply voltage for deep sub-micron technologies, and there is insufficient supply voltage for the additional voltage drop across the cascode transistor. Another alternative for the operational amplifier is a cascaded set of differential amplifiers.

There is therefore a need for a cascaded operational amplifier for use in stages of a pipeline ADC that achieves a relatively high speed, e.g., 80 megasamples per second (Ms/s), a relatively low settling time, and that has relatively low power consumption with a low supply voltage.

Such a low-power operational amplifier may have limited dynamic range. For example, the output voltage swing may be limited, and with a low supply voltage, the common mode voltage of the amplifier (called the "inherent" common mode voltage) may vary by a significant fraction of the supply voltage. One way to overcome this is by careful control of the inherent common mode voltage of each of the cascaded differential amplifiers. FIG. 3A shows a typical CMOS differential amplifier 300 with common mode control circuitry 305. Common mode control circuitry 305 typically requires a common mode current source in a feedback configuration, which may require one or more operational amplifiers, and thus itself consumes power. There typically is one such common mode control for the operational amplifier that includes the cascade of differential amplifiers. See U.S. Pat. No. 4,918,399 to Devecchi, et al. entitled "COMMON MODE SENSING AND CONTROL IN BALANCED AMPLIFIER CHAINS" for an example of common mode control circuitry that controls the common mode voltage of a set of cascaded differential amplifiers.

An alternate CMOS differential amplifier 330 is shown in FIG. 3B. Differential amplifier 330 includes its own local common mode feedback circuit in the form of resistive-averaged common mode feedback. Two equal sized resistors 333 of resistance R are placed between the two outputs and explicitly generate the inherent common mode voltage $V_{CM-AMP}$ at their connecting node 335. The connecting node 335 is connected to the commonly connected gates of transistors $M_1$ and $M_2$. The approximate gain of the differential amplifier is set by the product of the transconductance, $g_m$, of transistor M3, and the parallel combination of the output impedance of M1, M3, and the resistor of value R. Thus, differential amplifiers with different R values have different gains.

The output voltage swing of amplifier 330 is limited to about two threshold voltages. There thus is a difficulty of using such resistive common mode feedback amplifiers in the operational amplifier of the stages of a pipeline ADC that has a low supply voltage. In particular, the maximum and minimum output voltages of the differential amplifiers need to match the maximum and minimum references of the ADC to maximize the dynamic range.

There thus is a need for controlling the one or more reference voltages for the stages of a pipeline ADC relative to the inherent common mode voltages of the operational amplifiers in the stages. In particular, for operational amplifiers that include q cascade of differential amplifiers that each have their own common mode feedback, i.e., that each use resistive-common mode feedback, there is a need for controlling the one or more reference voltages for the stages of a pipeline ADC relative to the inherent common mode voltages of the operational amplifiers. There thus is a need for a method and apparatus for supplying one or more reference voltages to the stages of a pipeline ADC that provide for using an operational amplifier that has a limited dynamic range.

Wireless local area networks offer many advantages over wired local area networks. One advantage is the use with portable devices such as portable computers, personal digital assistants, and other devices. One desirable property of circuits for operation with portable devices is low power consumption.

The IEEE 802.11a standard has been established for operation in the UNII bands (5 GHz range) at 54 MBPS. Single-chip radio transceivers are now being promoted by several companies that conform to the IEEE standard, e.g., Atheros Communications (Sunnyvale, Calif.) which markets its AR5000 chipset. Such chipsets put complete 5.15–5.35 GHz transceivers on a chip, and need only few external filters, a transmit/receive switch and a crystal to operate. Makers like Atheros and Radiata Communications (San Jose, Calif., acquired by Cisco Systems, Inc., the assignee of the present invention) produce single-chip radio transceiver devices that operate at low signal power-output levels. Such companies also are designing single-chip modems for operation with the single-chip transceivers and conforming to the IEEE 802.11a standard. See the First Parent Application. Such a modem generates the analog signal for transmission by the transmitter part of the transceiver, and also accepts the analog signal from the receiver part of the transceiver. The receive path includes digitizing the received signal using an analog-to-digital converter.

There is thus a need for an ADC that can be incorporated in a modem chip, that operates with relatively low power, and that provides for the modem to conform to the standards such as the IEEE 802.11a standard.

For more information on the IEEE 802.11a standard, see: (1) Draft Supplement to Standard For Telecommunications and Information Exchange Between Systems—LAN/MAN Specific Requirements—Part 11: Wireless Medium Access Control (MAC) and physical layer (PHY) specifications: High Speed Physical Layer in the 5 GHz band. {P802.11a/D7.0 July 1999}; (2) Draft Standard for Information technology—Telecommunications and information exchange between systems—Local and metropolitan area networks—Specific requirements—Part 11: Wireless LAN Medium Access Control (MAC) and Physical Layer (PHY) specifications {ANSI/IEEE Std 802.11, 1999}; and (3) http://www.manta.ieee.org/groups/802/11/.

SUMMARY

Described herein is a pipeline analog-to-digital converter (ADC) that includes cascaded stages each for resolving at least one bit of an analog voltage. Each stage has an analog input, one or more reference voltage inputs, and one or more digital outputs. The analog voltage is coupled to the analog input of the first stage. Each stage but the last has an analog output connected to the analog input of the next stage, and includes an operational amplifier that has one or more differential amplifiers having an inherent common mode voltage.

The pipeline ADC also includes a reference generator to generate the one or more reference voltages for the stages. The reference generator includes a circuit to track the inherent common mode voltage of the differential amplifiers such that the generated reference voltages are relative to the inherent common mode voltages of the differential amplifiers.

The pipeline ADC also includes a combiner accepting the digital outputs of the stages as input and producing the digital representation of the input voltage.

An embodiment of the operational amplifier includes a cascaded chain of differential amplifiers, each differential amplifier including its own common mode feedback, i.e., resistive-averaged common mode feedback to produce the inherent common mode voltage for the operational amplifier. For that embodiment, the reference generator includes an amplifier that in a resistive common mode feedback configuration having a node that generates a mimicked common mode voltage that mimics the inherent common mode voltage of the operational amplifiers. An embodiment of the reference generator further includes a resistive network having a common mode node and one or more reference voltage nodes, a current source to provide current through the resistive network, a current controller connected to the resistive network and having a control input to control the magnitude of the current through the resistive network, and a feedback error signal generator connected to the mimicked common mode voltage and to the common mode of the resistive network, the feedback error signal generator to generate a current control signal connected to the control input such that the common mode of the resistive network is substantially maintained at the same voltage as the mimicked common mode voltage.

Other features and advantages of the invention will be clear from the drawings and detailed description that follow.

DETAILED DESCRIPTION

Figure 1:
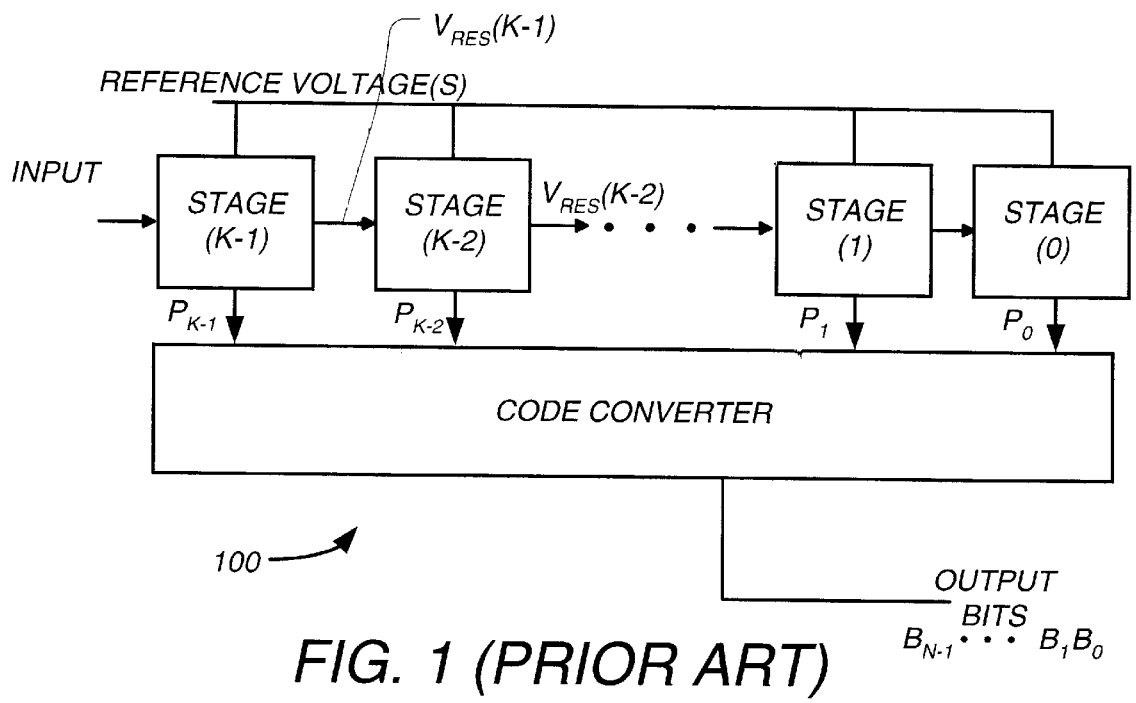
FIG. 1 shows an example of a pipeline analog-to-digital converter.
Figure 2:
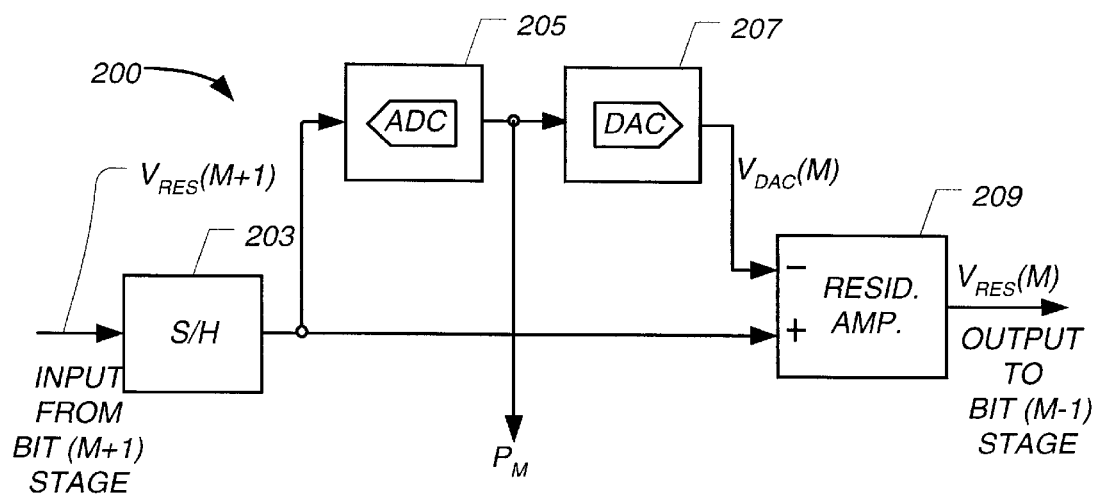
FIG. 2 shows an example of one of the stages of the typical pipeline analog-to-digital converter of FIG. 1.
Figure 4:
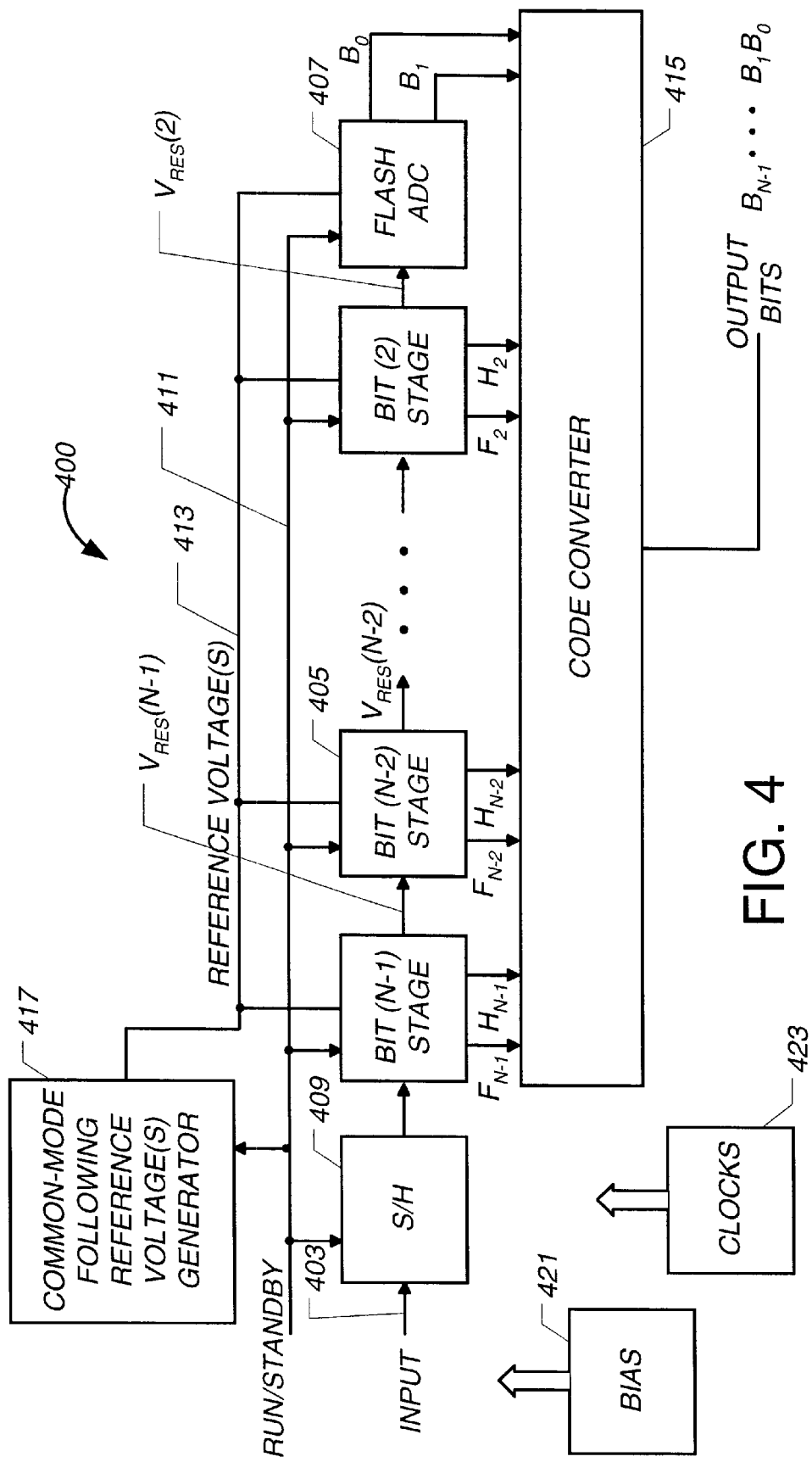
FIG. 4 shows one embodiment of a pipeline analog-to-digital converter according to aspects of the invention.

FIG. 4 shows in block diagram form one embodiment of a pipeline analog-to-digital converter 400 that includes a plurality of cascaded stages each for resolving at least one bit of an analog voltage input 403. While this in general conforms to the architecture of FIG. 1, ADC 400 includes several innovative features. In one embodiment, the last stage is a 2-bit flash analog-to-digital converter 407 that generates as output two least significant bits $B_0$ and $B_1$ of the digital representation of the analog input. Each stage other than the last resolves "one and a half" bits. A stage other than the last shall be referred to an intermediate stage herein. For an N-bit analog-to-digital converter, there are N−2 identical "one and a half" bit stages and one last stage. Each "one and a half" bit intermediate stage has a three value digital output that in one embodiment is in the form of two one-bit outputs called the full-bit output and the half-bit output. For example, the second intermediate stage—the "bit (N−2) stage" 405—has full bit output $F_{N-2}$ and half bit output $H_{N-2}$. Furthermore, each intermediate stage has an analog input denoted $V_{RES}(M-1)$ for the M'th stage, M=N−1, . . . , 2, one or more reference voltage inputs 413, and an analog output, denoted $V_{RES}(M)$ for the M'th stage (M=N−1, . . . , 2) and connected to the analog input of the next stage.

A combiner 415, e.g., a code converter, combines the full-bit and half-bit digital outputs of the intermediate stages and the two least significant bits to generate the N-bit digital representation of the input voltage 403.

The intermediate stages each include a sample and hold circuit, and in the embodiment of FIG. 4, the sample and hold is incorporated in the output of each intermediate stage. For that reason, the pipeline ADC 400 includes an additional sample and hold circuit 409 for the input voltage 403.

In accordance to one aspect of the invention, pipeline ADC 400 includes a run/standby signal 411 that provides for switching the ADC between a RUN state and a low power consumption standby state.

Each intermediate stage includes an operational amplifier that includes one or more differential amplifiers having an inherent common mode voltage. ADC 400 includes a reference generator 417 to generate the one or more reference voltages 413 for the stages. The reference generator 417 including a circuit to track the inherent common mode voltage of the differential amplifiers such that the generated reference voltages 413 are relative the inherent common mode voltages of the differential amplifiers.

As would be clear to those in the art, there also are other signals in ADC 400 that such as sampling and other clock signals, and voltage and bias supply signals. Clock signal generation is shown by clock generator 423 and bias supplying is shown by bias supply block 421.

In one embodiment, run/standby signal 411 switches one or more of the bias supplies. In particular, the bias supplies from bias supply block 421 to the operational amplifiers in pipeline ADC 400 are switched between two states: a low power bias state and a full power bias state to provide a low power bias and full power bias to the operational amplifiers in pipeline ADC 400.

Figure 5:
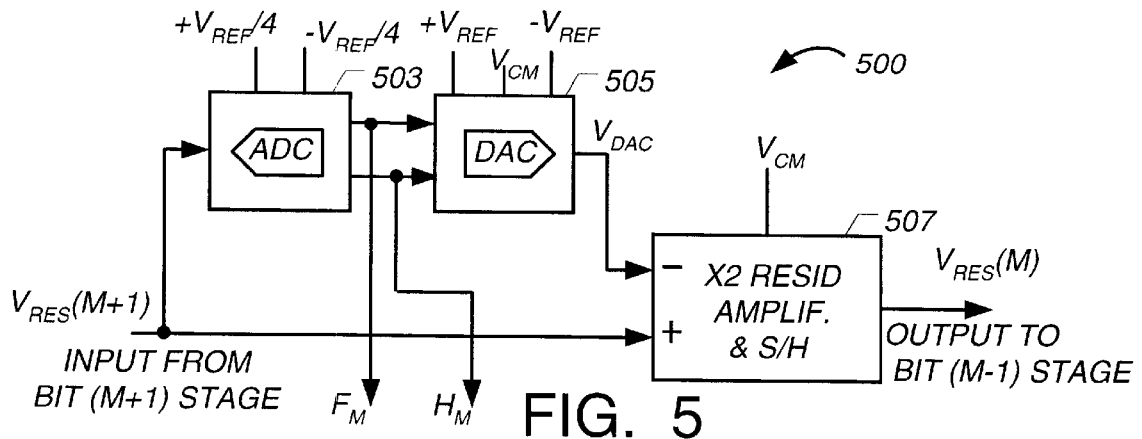
FIG. 5 shows one embodiment of a stage of the pipeline analog-to-digital converter of FIG. 4.

FIG. 5 shows one embodiment 500 of an intermediate stage, in general the M'th stage, M=N−1, . . . , 2. In this embodiment, the encoding of the digital outputs, i.e., full-bit output $F_M$ and half bit output $H_M$ of the intermediate stage for various input voltages $V_{RES}(M+1)$ compared to the reference voltage $V_{REF}$ is as follows:

| Condition | $F_M$ | $H_M$ |
| --- | --- | --- |
| $V_{RES}(M+1) > V_{REF}/4$ | 1 | 0 |
| $V_{RES}(M+1) < -V_{REF}/4$ | 0 | 0 |
| $-V_{REF}/4 < V_{RES}(M+1) < V_{REF}/4$ | 0 | 1 |

An analog-to-digital converter 505 in the form of comparators produces the digital outputs $F_M$ and $H_M$ from the input $V_{RES}(M+1)$. These digital outputs are input to a simple digital-to-analog converter (DAC) 505 that determines $V_{DAC}$ which in one embodiment is a multiple of half the reference voltage depending on the values of the full and half bit outputs according to the following table:

| $F_M$ | $H_M$ | $V_{DAC}$ |
| --- | --- | --- |
| 1 | 0 | $+V_{REF}/2$ |
| 0 | 0 | $-V_{REF}/2$ |
| 0 | 1 | 0 |

$V_{DAC}$ is now subtracted from the input voltage $V_{RES}(M+1)$ and the result amplified with a gain of 2 by a times-two residue amplifier 507. In one embodiment, residue amplifier 507 includes a sample and hold in its output. The analog output of intermediate stage 500 is the output of the sample and hold of the times-two residue amplifier 507. The functionality of intermediate stage 500 can thus be summarized by the following table:

| Condition | $F_M$ | $H_M$ | Output $V_{RES}(M)$ |
| --- | --- | --- | --- |
| $V_{RES}(M+1) > V_{REF}/4$ | 1 | 0 | $2 \cdot RES(M+1) - V_{REF}$ |
| $V_{RES}(M+1) < -V_{REF}/4$ | 0 | 0 | $2 \cdot RES(M+1) + V_{REF}$ |
| $-V_{REF}/4 < V_{RES}(M+1) < V_{REF}/4$ | 0 | 1 | $2 \cdot RES(M+1)$ |

Referring back to FIG. 4, in one embodiment, code converter 415 is a combinatorial circuit that forms the binary sum of the word that includes the concatenation of the full-bit outputs and the two least significant bits with the word of the concatenation of the half-bit outputs right-shifted by one. How to implement such a combinatorial circuit would be clear to one of ordinary skill in the art.

Figure 6A:
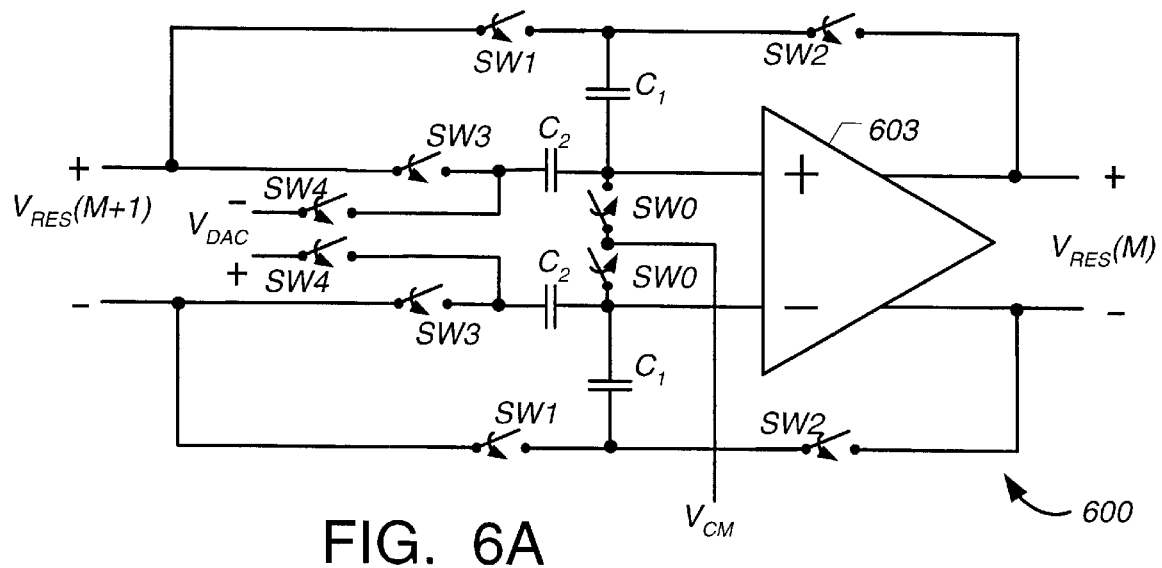
FIG. 6A shows a switched capacitor residual amplifier according to one embodiment of the invention.

FIG. 6A shows one embodiment 600 of the times-two residue amplifier 507. Residue amplifier 600 is a fully balanced switched capacitor amplifier that includes a fully balanced differential operational amplifier 603 with two main switching phases. In a first phase, called the charging phase of the conversion time. switches SWO are first closed to connect one end of capacitors $C_1$ and capacitors $C_2$ to the common mode voltage $V_{CM}$. Still in the charging phase, after a small delay, switches SW1 and switches SW3 are closed so that the two pairs of capacitors are charged to the input voltage. At the end of the charging phase, switches SW0 are first opened, and once the switches SW0 are open, switches SW1 and switches SW3 are opened. The second phase called the amplifying phase now starts with switches SW2 and switches SW4 closing. In one embodiment, capacitors $C_1$ and $C_2$ have the same capacitance so that the residue amplifier provides times-two amplification.

Figure 6B:
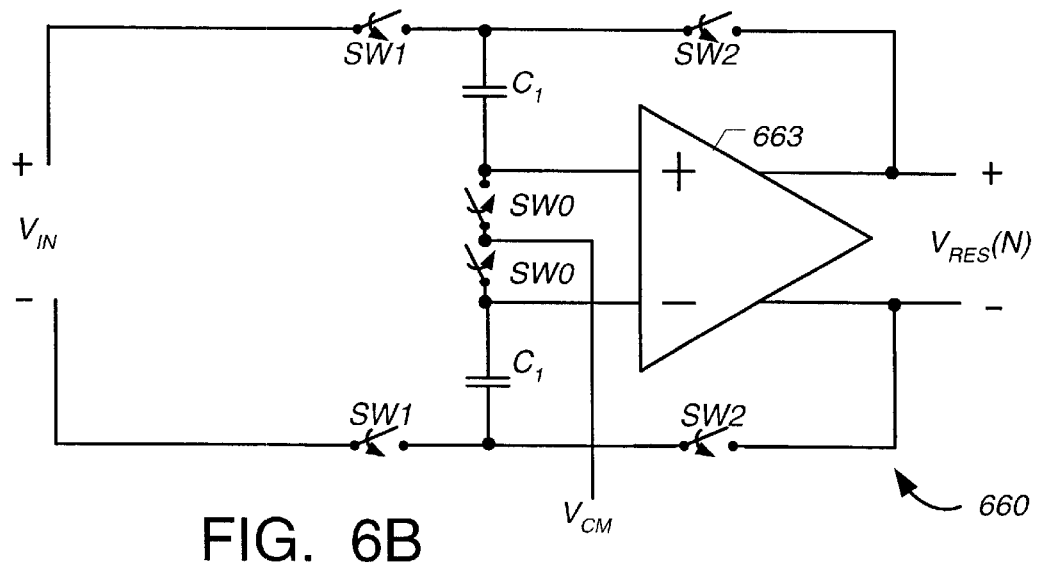
FIG. 6B shows a switched capacitor sample and hold circuit according to one embodiment of the invention.

In one embodiment, sample and hold 409 (FIG. 4) is a switched capacitor CMOS sample and hold circuit. FIG. 6B shows one embodiment 660 of the sample and hold 409 that is similar in architecture to the residue amplifier 600 of FIG. 6A in that it includes a fully balanced operational amplifier 663 and switched capacitors $C_1$. In one embodiment, the operational amplifier 663 of the sample and hold circuit 660 is identical to the operational amplifier 603 used in residue amplifier 600 of FIG. 6A.

The operational amplifiers 603 and 663 are now described in more detail.

It is desired to operate the pipeline ADC at high speed, 80 megasamples per second (Ms/s) sampling rate in one embodiment. It is further desired that the pipeline ADC have a low supply voltage, e.g., 2.5V, and low power consumption. Thus high gain, low supply voltage fully differential operational amplifiers are desired.

One prior art technique of obtaining high gain is cascading. Because of the difficulties of cascading in deep sub micron processes. alternatives must be used. To increase the gain, in one embodiment, cascading is used. A typical two-stage design may not provide sufficient gain, so in one embodiment, a three-stage cascade design is used with compensation capacitors for the frequency compensation. It was found that with the three-stage design described herein, the compensation capacitors were smaller than might typically be required for a hypothetical two-stage design were such a two-stage design possible with the required settling time requirement. Charging up compensation capacitors typically uses up power, and the three-stage design described herein has lower power consumption than the hypothetical two-stage design.

Figure 3A:
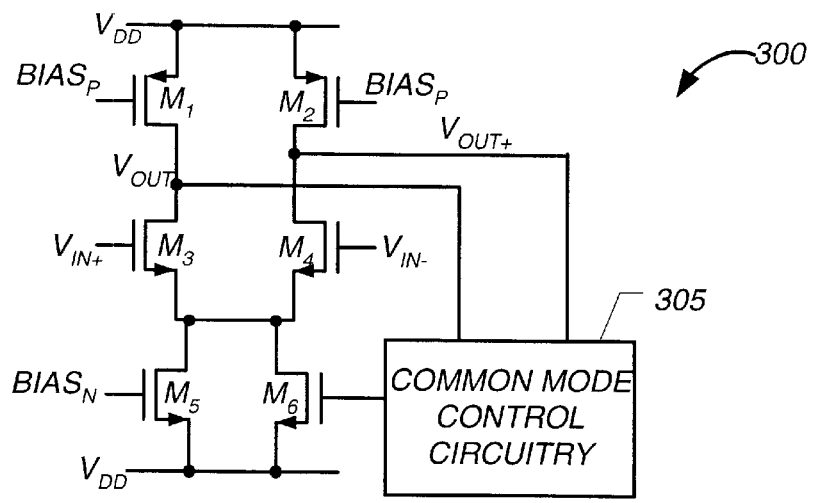
FIG. 3A shows a CMOS differential amplifier with common mode control circuitry.
Figure 3B:
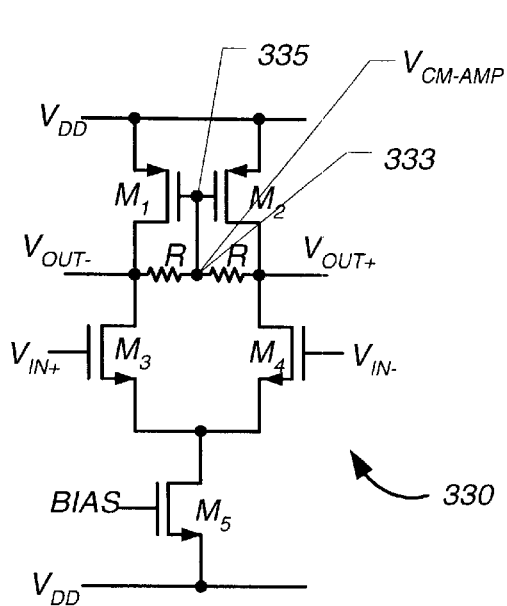
FIG. 3B shows a CMOS differential amplifier with resistive-averaged common mode feedback.

A low-power low-supply voltage operational amplifier may have limited dynamic range. For example, the output voltage swing may be limited, and with a low supply voltage, the inherent common mode voltage of the amplifier may vary by a significant fraction of the supply voltage. One way to overcome this is by careful control of the inherent common mode voltage of each of the cascaded differential amplifiers. FIG. 3A shows a typical CMOS differential amplifier 300 with common mode feedback control circuitry 305. Common mode control circuitry 305 typically requires a common mode current source in a feedback configuration, which may require one or more operational amplifiers, and thus itself consumes power. In one embodiment of the present invention, resistive-averaged common mode feedback is used. A CMOS differential amplifier 330 resistive-averaged common mode feedback is shown in FIG. 3B. Two equal sized resistors 333 of resistance R are placed between the two outputs and explicitly generate the inherent common mode voltage $V_{CM-AMP}$ at their connecting node 335. The connecting node 335 is connected to the commonly connected gates of transistors $M_1$ and $M_2$. The approximate gain of the differential amplifier is set by the product of the transconductance, $g_m$, of transistor M3, and the parallel combination of the output impedance of M1, M3, and the resistor of value R.

Figure 7:
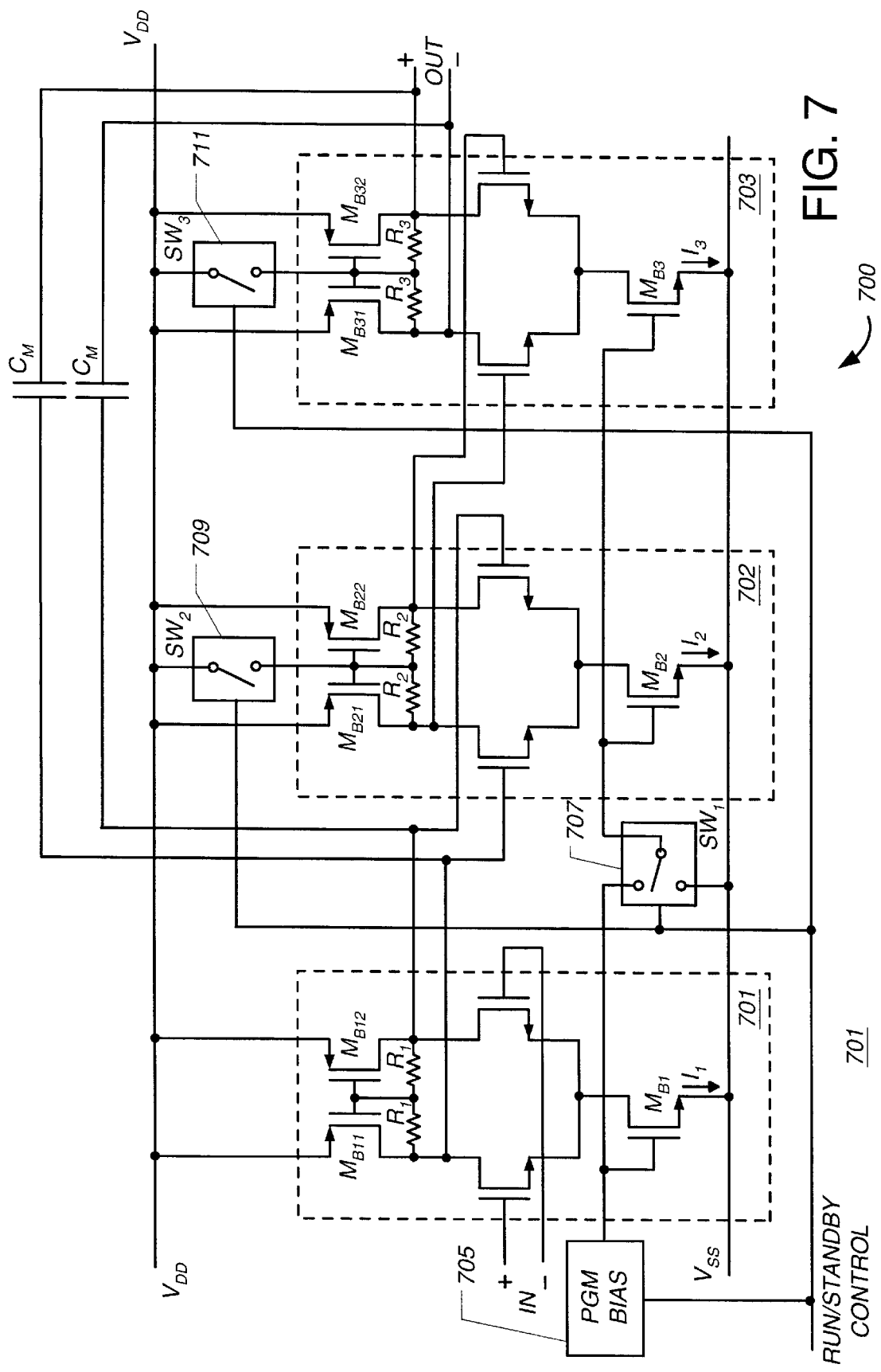
FIG. 7 shows an operational amplifier for use in a residual amplifier of a stage of a pipeline analog-to-digital converter.

FIG. 7 shows one embodiment of a three stage operational amplifier comprising a first differential amplifier 701, a second differential amplifier 702, and a third differential amplifier 703 in cascade. Frequency compensation is provided by capacitors $C_M$, which are Miller compensation capacitors. The first differential amplifier 701 is chosen to have the highest gain of the three differential amplifiers. The resistances $R_1$ are chosen to be sufficiently high to not load up this first differential amplifier so that the gain is maintained high at all times.

In one embodiment, the operational amplifier 700 is designed to have an overall gain of 73 dB. The first differential amplifier 701 is designed to provide a gain of about 35 dB. This first differential amplifier 701 is biased to use a supply current of 1 mA.

The second and third differential amplifiers 702 and 703, respectively, are chosen to have gains of approximately 6 dB and 30 dB, respectively. The second and third differential amplifiers 702 and 703, respectively, are biased to use a supply current of about 3 mA each. In one embodiment, a single Miller compensation loop with a Miller capacitor $C_M$ is used between the third differential amplifier 703 and the second differential amplifier 702 on each of the sides of the differential amplifiers. Other embodiments of the invention may use other compensation techniques, including using two nested Miller compensation loops or other known compensation methods.

For compensation, in the single loop embodiment, the bandwidth of the second differential amplifier 702 is selected to be sufficiently high so that the second differential amplifier contributes a pole which has relatively high frequency so that with the Miller compensation applied, this leads to a complex pole pair that has a high enough frequency and a low enough Q to not contribute significantly to limiting the dynamic response of the operational amplifier 700.

Having a three-stage cascade operational amplifier rather than more complex architectures provides for easy transfer to different processes. A version of the design was built for a 2.5V TSMC (Taiwan Semiconductor Manufacturing Company, Taiwan) CMOS process. A version also was made for a 1.8V and a 3.3 V CMOS process..

One aspect of the invention is providing a mechanism in the pipeline ADC and the operational amplifiers to operate with very low power. One mechanism for keeping the power consumption low is switching the ADC off when not needed. For example, the pipeline ADC is for use in a low power wireless modem chip that can operate in a half duplex mode, i.e., that may not transmit and receive at the same time. In order to lower the power consumption, a RUN/STANDBY control signal is used to switch the pipeline ADC between a low power or no-power standby mode and a run mode. The ADC stays substantially in standby mode when the transceiver and modem are in transmit mode, and in run mode most of the time that the transceiver and modem are in receive mode. Switches are provided in operational amplifier 700 to switch the amplifiers between a low power or no-power standby mode and a run mode.

Switching a differential amplifier on and off, for example by switching the bias transistors and the current mirror transistors on and off, produces a transient response with a decay or rise time that depends on the circuit impedances. For a differential pair with high gain, the common mode resistors of value R is also high in order to main the high gain. Thus common mode resistor R of the first differential amplifier 701 was chosen to be high. As a result, the time constant due to the common mode resistors of value R and the gate capacitance of the transistors was found to be too high to satisfy the turnaround time from transmit to receive that can be tolerated under the IEEE 802.11a standard for wireless local area networks (WLANs) in the 5 GHz region. In the IEEE 802.11a standard, the turnaround time needs to be within approximately 1–2 $\mu$s.

In one embodiment of the invention, the highest gain differential amplifier, i.e., the first differential amplifier is always on and the other differential amplifiers, i.e., the second and third differential amplifiers in this embodiment, are switched on and off under control of the RUN/STANDBY control signal. In one embodiment, switch SW1 (707) switches off the bias transistors bias transistors $M_{B2}$ and $M_{B3}$ of the second and third differential amplifiers, respectively, by connecting their respective gates and sources when the RUN/STANDBY signal is in the standby state. In addition, switches SW2 (709) and SW3 (711) switch off bias transistor pairs with bias transistors $M_{B21}$, $M_{B22}$ and $M_{B31}$, $M_{B32}$ of the second and third differential amplifiers, respectively, by connecting their respective gates and sources when the RUN/STANDBY signal is in the standby state.

In another embodiment, the highest-gain differential amplifier, i.e., the first differential amplifier 701 is switched between fully on and a low power mode under control of the RUN/STANDBY control signal. This provides lower power consumption than the embodiment in which the highest-gain differential amplifier is always fully on, while still providing a faster settling time than if highest-gain differential amplifier was switched off when in standby mode.

The following are the nominal specifications of the operational amplifier. The design met design targets over process and temperature.

| Process | TMSC 0.25 micron standard digital CMOS |
|---|---|
| DC Gain | 73 dB + 3 dB − 2 dB, with 35 dB for the first differential amplifier, 6 dB for the second, and 30 dB for the third differential amplifier. |
| Unity Gain Bandwidth | 700 MHz ± 200 MHz. The required unity-gain bandwidth from overall ADC requirements was 500 MHz |
| Phase Margin | 68 degrees |
| Supply Current | 7 mA with 1 mA for the first differential amplifier, and 3 mA for the second and third differential amplifiers. |
| Output voltage swing | 800 mV peak-to-peak per side |
| Die Area on chip | 150 $\mu$m by 60 $\mu$m |
| Slew Rate (1 p load) | 1.6 V/ns |

Figure 9:
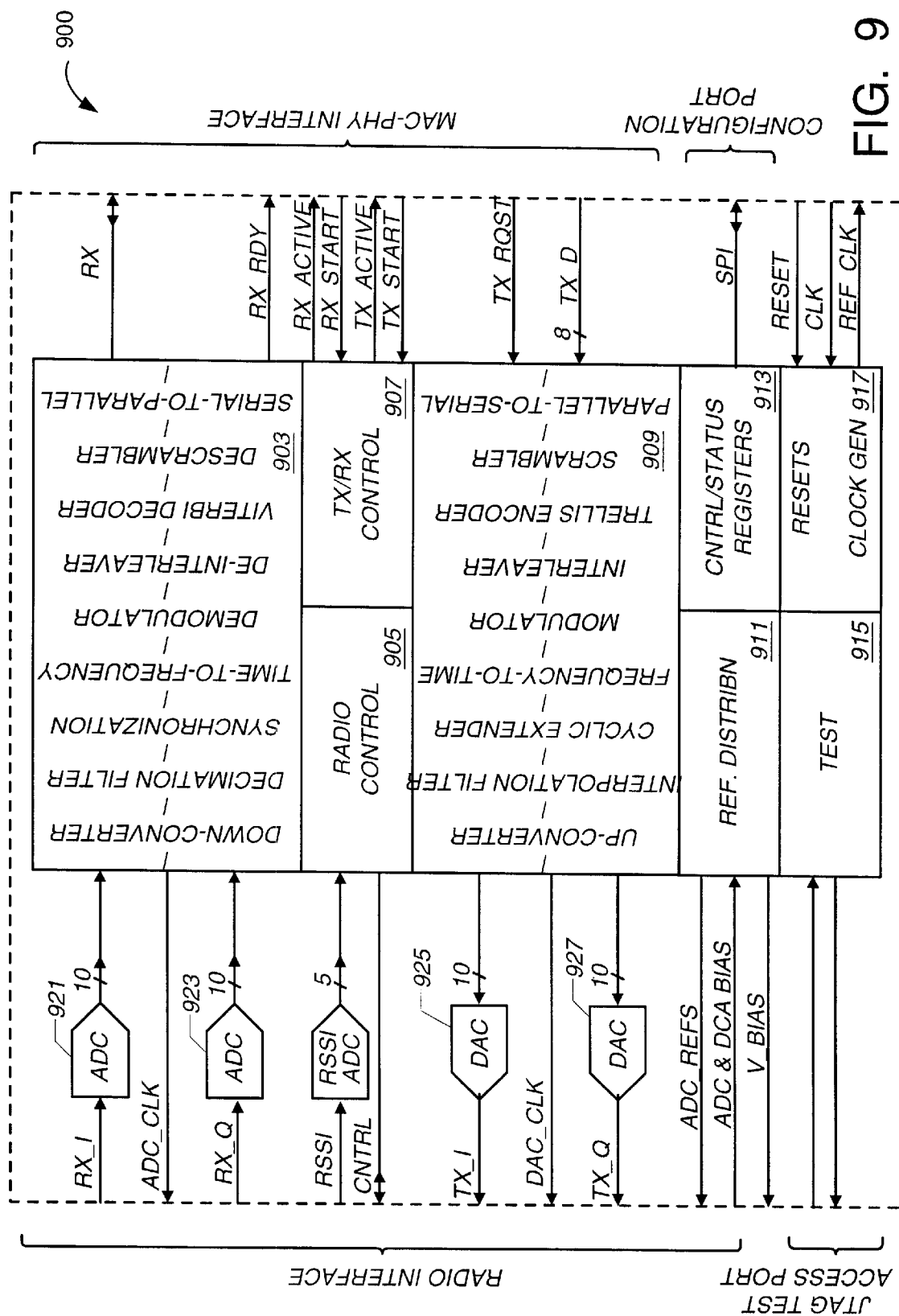
FIG. 9 shows a block diagram of a modem integrated circuit that includes embodiments of the inventive pipeline ADCs.

One embodiment of the pipeline ADC is for incorporation in a modem chip that works together with a single-chip transceiver to implement the physical layer of an IEEE 802.11a conforming wireless local area network. FIG. 9 shows in simplified block diagram form an embodiment 900 of the modem chip. Modem chip 900 is configured to operate with a transceiver chip. One such transceiver chip is described in above-mentioned and incorporated-by-reference United States Provisional Patent Application serial No. 60/283,609 (the Second Patent Application).

The ADCs 921 and 923 accept fully differential I and Q analog signals from the transceiver chip. The receive signal processor 903 accepts the digitized receive signals from ADCs 921 and 923 and carries out the following operations: down-conversion, anti-alias filtering, OFDM symbol synchronization, time-to-frequency conversion, sub-carrier demodulation, de-interleaving, Viterbi decoding, descrambling, and serial-to-parallel conversion. The output of the receive processor 903 goes to an off-chip MAC processor.

The receive input of modem 900 can interface to two basic receiver configurations.

1. A quadrature radio with baseband I and Q differential outputs which are sampled at 40 Ms/s by the ADCs. In such a case the ADC outputs are filtered by 2:1 decimating filters in the receiver signal processor 903.
2. A bandpass IF radio with real bandpass IF differential output centered at 20 MHz. The analog input from the transceiver chip is sampled at 80 Ms/s by one ADC and an internal IQ down-converter in processor 903 generates baseband I and Q channel outputs. The decimating filters are configured as a 4:1 decimating low-pass filters.

In one embodiment, the transmit and receive data paths in modem 900 are completely independent, allowing full-duplex as well as half-duplex operation.

Note that another embodiment of the modem chip is only for implementation with a bandpass IF radio, so that only a single differential ADC, rather than the two ADCs 921 and 923 shown in FIG. 9 is included for the receive path. The analog input from the transceiver chip is sampled at 80 Ms/s by that ADC and an internal IQ down-converter in processor 903 generates baseband I and Q channel outputs. The decimating filters are configured as a 4:1 decimating low-pass filters.

The transmit processor 909 performs parallel-to-serial conversion, scrambling, encoding, bit-interleaving, sub-carrier modulation, OFDM time symbol generation, cyclic extension, filtering and up-conversion. The resulting digital signals are converted to analog I and Q signals by digital-to-analog converters 925 and 927. These analog signals are input to the transceiver chip.

The architecture shown in FIG. 9 supports all the raw data rates and modulation schemes specified by IEEE 802.11a, mandatory and optional, plus three additional proprietary configurations.

Operation of the modem 900 is controlled and monitored by a set of 48 16-bit control and status registers that are accessed via a 4-pin Serial Peripheral Interface (SPI).

The radio is controlled by radio control block 905 that includes start-of-packet detection and automatic gain control for dynamically setting the gains and the performance of the transceiver. The receive and transmit functions of the modem are controlled by an RX/TX control block 907 that both provides controlling the function of the modem under control of the off-chip MAC controller and that provides control signals to the off-chip MAC controller.

In order to keep the power consumption of the modem chip low, the analog to digital converters are only kept on when necessary. There thus are RUN/STANDBY signals for each of the ADCs 921 and 923. Furthermore, there are controlled bias circuits for the analog components of the modem chip and provide for switching bias currents on and off from different subsections of the modem chip, and that also provide for switching the bias current from a first level to a second level.

In one embodiment, the highest-gain, i.e., first, differential amplifier of each of the operational amplifiers of the stages of the pipeline ADC is switched between a low-bias level (standby state) and a full bias level (run mode) by the RUN/STANDBY signal. Both the run state bias level and the standby state bias level are programmable.

The output voltage swing of the interstage amplifier 330 (FIG. 3B) is limited to about two threshold voltages. The reference generator 417 (FIG. 4) including a circuit to track the inherent common mode voltage of each of the differential amplifiers such that the generated reference voltages 413 are relative to the inherent common mode voltages of the differential amplifiers.

Figure 8A:
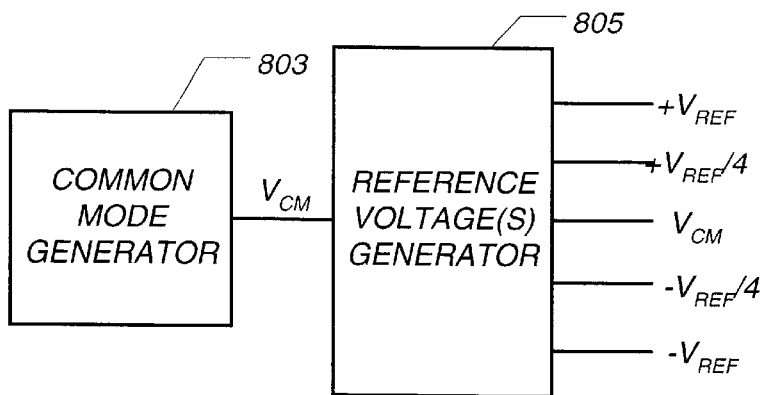
FIG. 8A shows a block diagram of a reference generator that includes a mimicked common mode generator circuit.

FIG. 8A shows a simplified block diagram of the reference supply voltage generator 417 (FIG. 4). Common mode generator 803 includes a circuit that mimics the common mode generation of all the differential amplifiers in the operational amplifiers used in the pipeline ADC, and thus generated a common mode voltage $V_{CM}$ that tracks the inherent common mode voltages of the differential amplifiers in the operational amplifiers. The reference voltage generator block 805 generates the various reference voltages for the pipeline ADC stages such that the generated reference voltages are relative to the tracked inherent common mode voltages of the differential amplifiers. Digital input 807 controls the full-scale voltage of the references, denoted VREF. In one embodiment for the one-and-one-half-bits-per-stage pipeline ADC described herein, the reference generator generates $V_{CM}$, $\pm V_{REF}$ and $\pm V_{REF}/4$. These voltages are distributed to the ADC stages. Other implementations would generate other reference voltages required by particular implementations of the pipeline ADC stages.

Figure 8B:
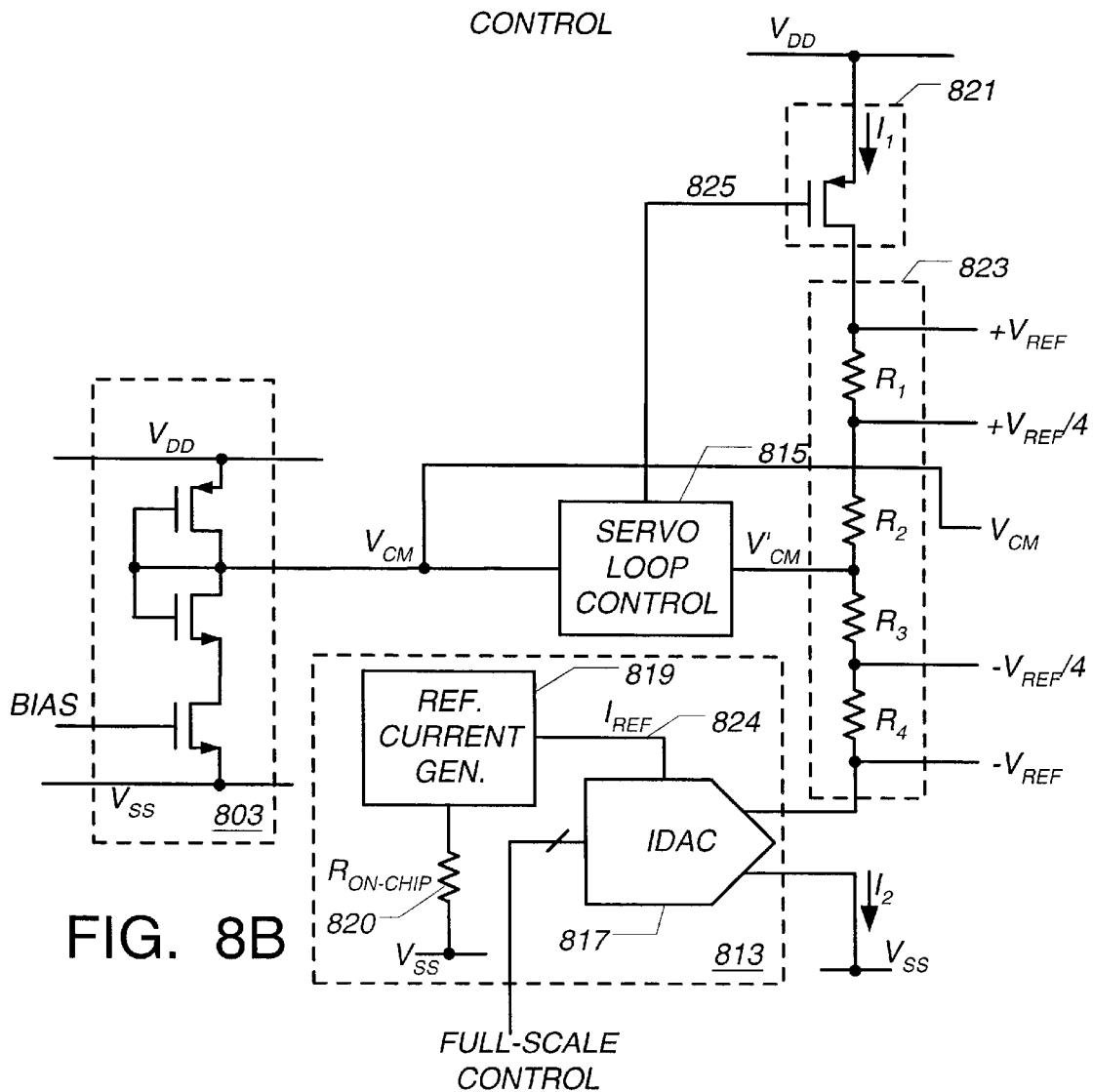
FIG. 8B shows in more detail an embodiment of the reference generator of FIG. 8A.

FIG. 8B shows an embodiment of the reference voltage generator in more detail. The common mode generator 803 includes an amplifier that in a resistive common mode feedback configuration having a node that generates a mimicked common mode voltage that mimics the inherent common mode voltage of the differential amplifiers of the operational amplifiers. The amplifier is an instance of one half of the differential amplifier in the three-stage operational amplifiers.

The reference generator further includes a resistive network 823 having a common mode node $V'_{CM}$ and one or more reference voltage nodes. In this embodiment, four resistances are connected in series to produce the voltages $\pm V_{REF}$ and $\pm V_{REF}/4$ with respect the common mode node $V'_{CM}$.

The reference generator also includes a current source 813, referenced from the programmable reference voltage generator, to provide current through the resistive network. The current provided by the current source is programmable by full scale control signal 807.

The reference generator also includes a current controller 821 connected to the resistive network and having a control input 825 to control the magnitude of the current through the resistive network, and a feedback error signal generator ("servo loop control") 815 connected to the mimicked common mode voltage $V_{CM}$ of common mode generator 803 and to the common mode $V'_{CM}$ of the resistive network. The feedback error signal generator 815 generates the current control signal connected to the control input 825 such that the common mode $V'_{CM}$ of the resistive network is substantially maintained at the same voltage as the mimicked common mode voltage $V_{CM}$.

In one embodiment, the current controller 821 includes a FET transistor with the control input 825 coupled to the gate.

In one embodiment, the current source 813 includes a current digital-to-analog converter (IDAC) 817 whose current (shown as I2) is controlled by a 4-bit full-scale control input. The IDAC generates a current determined by a reference current 824 generated by a reference current generator 819. In one embodiment the reference current generator puts a known constant voltage across a known on-chip reference resistor 820. Thus any process variations in the resistances of the resistive network 823 will be mimicked by the reference resistor 820 of the reference current generator 819. In this manner, the current generated by the current source 813 varies in a manner that maintains the reference voltages generated by the reference voltage generator substantially constant; the reference voltages are proportional to the known constant voltage.

In the steady state, the currents $I_1$ through the current controller 821 and $I_2$ generated by the current generator 813 are the same.

Because of the low supply voltage, one embodiment distributes currents to generate the references locally for each operational amplifier rather than distributing the reference voltages. This reduces problems due to resistive voltage ("IR") drops on $V_{DD}$ relative to the bias voltage, such that the locally generated bias voltages include any IR drops and the correct bias currents are maintained. However it is assumed that IR drops on VDD do not cause the inherent local common mode voltage, $V_{CM\ AMP}$ of the operational amplifier to be substantially different from the global mimicked reference $V_{CM}$, added to the fact the variations of $V_{CM}$ are more tolerable than variations in bias voltages. Thus the reference voltages are globally distributed for each ADC stage operational amplifier.

Figure 10:
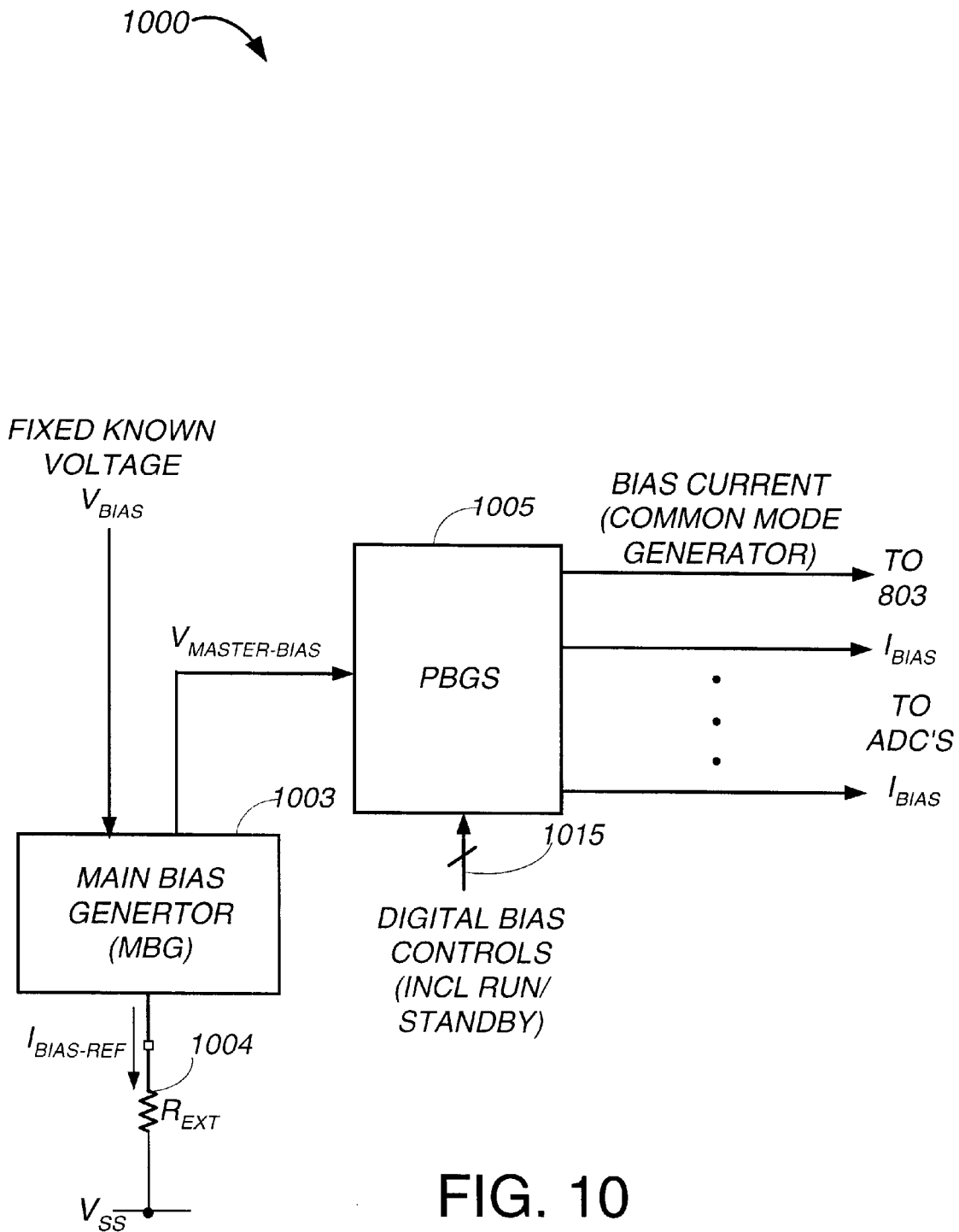
FIG. 10 shows an embodiment of a bias power supply that supplied subsections of the modem of FIG. 9, including one or more of the inventive pipeline ADCs.

FIG. 10 shows one embodiment 1000 of a bias current supply that includes programmable elements that provide for switching the bias to the highest-gain differential amplifiers of the operational amplifiers between a low standby level and a run level. This embodiment includes a master bias generator (MBG) 1003 that generates the correct bias voltage to set the master reference current $I_{MASTER-BIAS}$ into a set of programmable bias current generators (PBG) 1005. The value of the master reference current $I_{MASTER-BIAS}$ in the PBGs is set by the known voltage, $V_{BIAS}$, and the known external resistor, $R_{EXT}$. In one embodiment, the known voltage $V_{BIAS}$ is obtained from the reference voltage generator (see FIGS. 8A and 8B) from a resistive network. Because the generation of this fixed voltage is not directly part of generating the reference voltages for the stages, is it not shown in FIGS. 8A and 8B.

The PBGs 1005 distribute the bias current to the operational amplifiers of the pipeline ADC. One of the PBGs also distributed the bias current via a diode connected FET (not shown) to the common mode voltage generator 803 of the reference voltage generator (FIG. 8) and controls the power dissipation of the circuit by scaling the bias currents, in turn scaling, for example, operational amplifier currents. The value of $\pm V_{REF}$ is controlled by the programmable current generator 817 in the reference voltage generator (see FIG. 8B). In one embodiment, each of programmable bias generators includes a set of digital signal inputs 1015 that determine the magnitude of the reference voltages or the bias currents to the operational amplifiers and $V_{CM}$ generator. Having these programmable bias levels enables different subsections of the modem 900 to operate with different power and performance levels.

In one embodiment, a RUN/STANDBY signal is used to generate two sets of digital signal inputs 1015 such that the highest-gain, i.e., first, differential amplifier of each of the operational amplifiers of the stages of the pipeline ADC is switched between a low- bias level (standby state) and a full bias level (run mode) by the RUN/STANDBY signal. This provides for both the run state bias level and the standby state bias level to be programmable.

In one embodiment, each PBG also includes an enable input (part of signal inputs 1015) that if not set disables the current output of the PBGs.

Thus, while some embodiments, contexts, and applications have been described herein, the invention is not limited to those embodiments, contexts, and applications.

For example, a single Miller compensation loop for the three-stage operational amplifier has been described, but several other compensation techniques may also be used. Many methods are known in the art for compensating cascaded amplifiers, including using Miller compensation capacitors. See for example N. Leung, P. K. T. Mok, W. H. Ki, and J. K. O. Sin, "Damping-Factor-Control Frequency Compensation Technique for Low-Voltage Low-Power Large Capacitive Load Applications", IEEE International Solid-State Circuits Conference, San Francisco, Calif., pp. 158–159, 1999. See also F. You, S. H. K. Embabi, E. Sonchez-Sinencio, "Multistage Amplifier Topologies with Nested Gm-C Compensation," IEEE J. of Solid State Circuits, Vol. 32, No. 12, pp. 2000–2011, December 1997. See also the background section of U.S. Pat. No. 6,208,206 to Leung et al, entitled "FREQUENCY COMPENSATION TECHNIQUES FOR LOW POWER MULTISTAGE AMPLIFIERS" which describes and cites several such compensation techniques, and such techniques are also applicable to the design described herein.

Figure 3C:
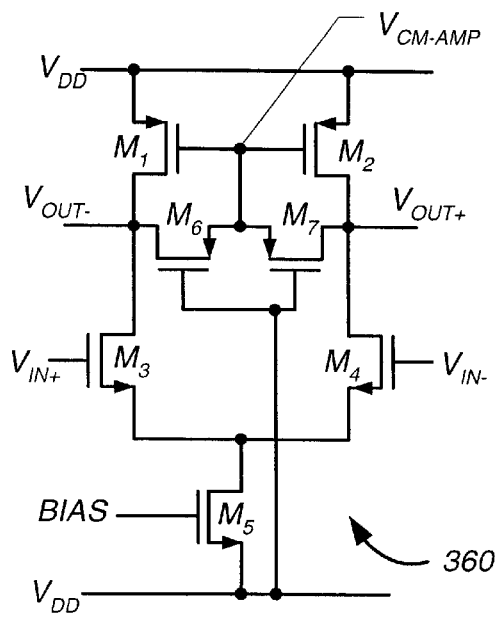
FIG. 3C shows an alternate embodiment of a CMOS differential amplifier with resistive-averaged common mode feedback, with the resistive common mode feedback provided by FETs.

Furthermore, while the resistive feedback differential amplifier embodiments described herein use resistors, other resistive feedback configurations may be used. In one alternate embodiment, shown in FIG. 3C as differential amplifier 3, FETs—$M_6$ and $M_7$ in this embodiment—are used to provide the resistive common mode feedback. In particular, for the first differential amplifier of the operational amplifier, long FETs may be used that have high output resistance and low parasitic capacitance. The gates of the resistive common mode feedback FETs $M_6$ and $M_7$ in FIG. 3C are connected to $V_{SS}$ to ensure that the FETs are on. The resistive feedback is then non-linear, so the output swing should be kept small, e.g., for the first stage in the operational amplifier. Active circuitry can then be used to increase the output swing. Other configurations for the differential amplifiers of the operational amplifier are possible. Some other such configurations are described in Jeffrey Harrison: "Opamps with local common-mode feedback," Technical Report, Department of Electronics, Macquarie University, Marsfield, NSW, Australia, Aug. 7, 2001, available on the Internet as http://www.elec.mg.edu.au/~jnharris/opampreport.ps.

Furthermore, while the operational amplifier embodiment described herein has three-stages, other embodiments may have more or fewer differential amplifiers in cascade.

Furthermore, while embodiments described herein are for an integrated circuit that includes MOS transistors, the invention is not restricted to MOS transistor circuits. Furthermore, while CMOS embodiments are described herein, the invention is not restricted to a CMOS integrated circuit.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention.

What is claimed is:

1. A pipeline analog-to-digital converter (ADC) comprising:

more than one cascaded stages each for resolving at least one bit of an analog voltage, each stage but the last having an analog input, one or more reference voltage inputs, and one or more digital outputs, the analog voltage coupled to the analog input of the first stage, each stage but the last also having an analog output connected to the analog input of the next stage, each stage but the last including an operational amplifier that includes one or more differential amplifiers having an inherent common mode voltage;

a reference generator to globally generate the one or more reference voltages for a plurality of the stages, the reference generator including a circuit to track the inherent common mode voltage of the differential amplifiers such that the generated reference voltages are relative the inherent common mode voltages of the differential amplifiers; and a combiner having the digital outputs of the stages as input and producing the digital representation of the input voltage.

2. A pipeline analog-to-digital converter as recited in claim 1, wherein the one or more reference voltages for the stages globally generated by the reference generator include the tracked common mode voltage.

3. A pipeline analog-to-digital converter as recited in claim 2, wherein the operational amplifier includes a cascaded chain of differential amplifiers, each differential amplifier including resistive-averaged common mode feedback to produce the inherent common mode voltage for the operational amplifier, and wherein the reference generator includes an amplifier in a resistive common mode feedback configuration having a node that generates a mimicked common mode voltage that mimics the inherent common mode voltage of the operational amplifiers, a resistive network having a common mode node and one or more reference voltage nodes, a current source to provide current through the resistive network, a current controller connected to the resistive network and having a control input to control the magnitude of the current through the resistive network, and a feedback error signal generator connected to the mimicked common mode voltage and to the common mode of the resistive network, the feedback error signal generator to generate a current control signal connected to the control input such that the common mode of the resistive network is substantially maintained at the same voltage as the mimicked common mode voltage.

4. A pipeline analog-to-digital converter as recited in claim 3, wherein the reference generator further includes a programmable current source to supply current to the resistive network such that the magnitude of the voltage references generated by the reference generator is programmable.

5. A pipeline analog-to-digital converter as recited in claim 4, wherein the analog-to-digital converter is part of a integrated circuit (chip) and wherein the programmable current source supplies a current which is proportional to reference current provided by applying a known constant voltage to an on-chip resistor so that the reference voltages are maintained proportional to the known constant voltage.

6. A pipeline analog-to-digital converter as recited in claim 1, wherein the magnitude of the voltage references generated by the reference generator is programmable.

7. A pipeline analog-to-digital converter as recited in claim 1, wherein the analog-to-digital converter is part of a wireless local area network modem to digitize signals received by a radio receiver.

8. A pipeline analog-to-digital converter as recited in claim 7, wherein the radio receiver and the modem receive signals conform to the IEEE 802.11a standard.

9. A pipeline analog-to-digital converter as recited in claim 1, wherein the digital representation of the input voltage includes 10 bits.

10. A pipeline analog-to-digital converter as recited in claim 1 implemented in a CMOS integrated circuit.

11. A pipeline analog-to-digital converter as recited in claim 10 capable of operating at a sampling frequency of at least 50 megasamples per second.

12. A pipeline analog-to-digital converter as recited in claim 11 capable of operating at a sampling frequency of at least 80 megasamples per second.

13. A pipeline analog-to-digital converter as recited in claim 1, wherein the operational amplifier includes a cascaded chain of differential amplifiers, each differential amplifier including resistive-averaged common mode feedback to produce the inherent common mode voltage for the operational amplifier.

14. A pipeline analog-to-digital converter as recited in claim 13, wherein the operational amplifier includes:

a cascaded chain of differential amplifiers, each differential amplifier including resistive-averaged common mode feedback to produce the inherent common mode voltage for the operational amplifier, a particular differential amplifier of the chain having the highest gain of the gains of the differential amplifiers;

one or more feedback paths each including a compensation capacitor to compensate the operational amplifier; and one or more switches controlled by a control signal to switch on or off the differential amplifiers of the chain other than the highest-gain differential amplifier of the chain, such that the power consumption of the operational amplifier is reduced by turning off the differential amplifiers other than the highest-gain differential amplifier while the dynamic response of the operational amplifier is not compromised by the highest-gain differential amplifier being turned on or off.

15. In a pipeline analog-to-digital converter that includes more than one cascaded stages each for resolving at least one bit of an analog voltage, each stage but the last having an analog input, one or more reference voltage inputs, and one or more digital outputs, the analog voltage coupled to the analog input of the first stage, each stage but the last also having an analog output connected to the analog input of the next stage, each stage but the last including an operational amplifier that includes one or more differential amplifiers having an inherent common mode voltage, a method of generating the one or more reference voltages for the stages of the analog-to-digital converter comprising:

generating a common mode voltage that tracks the inherent common mode voltage of the differential amplifiers, and globally generating one or more reference voltages to the one or more reference voltage inputs of a plurality of the stages, the globally generating reference voltages being relative to the generated common mode voltage that tracks the inherent common mode voltage of the differential amplifiers.

16. A pipeline analog-to-digital converter (ADC) comprising:

more than one cascaded stages each for resolving at least one bit of an analog voltage, each stage but the last having an analog input, one or more reference voltage inputs, and one or more digital outputs, the analog voltage coupled to the analog input of the first stage, each stage but the last also having an analog output connected to the analog input of the next stage, each stage but the last including an operational amplifier that includes one or more differential amplifiers having an inherent common mode voltage;

a reference generator to globally generate the one or more reference voltages for a plurality of the stages, the reference generator including means for tracking the inherent common mode voltage of the differential amplifiers such that the generated reference voltages are relative the inherent common mode voltages of the differential amplifiers; and combining means for combining the digital outputs of the stages and producing the digital representation of the input voltage.

17. A modem for a wireless local area network to receive and process an analog signal from a radio receiver, the modem including:

one or more pipeline analog-to-digital converters to digitize the analog signal from the radio receiver to form digitized received signals; each pipeline analog-to-digital converter including:

more than one cascaded stages each for resolving at least one bit of the analog signal, each stage but the last having an analog input, one or more reference voltage inputs, and one or more digital outputs, the analog signal coupled to the analog input of the first stage, each stage but the last also having an analog output connected to the analog input of the next stage, each stage but the last including an operational amplifier that includes one or more differential amplifiers having an inherent common mode voltage;

a reference generator to globally generate the one or more reference voltages for a plurality of the stages, the reference generator including a circuit to track the inherent common mode voltage of the differential amplifiers such that the generated reference voltages are relative the inherent common mode voltages of the differential amplifiers; and a combiner having the digital outputs of the stages as input and producing the digitized received signal representation of the input signal; and a receive signal processor to process the digitized received signals, the processing including demodulating the digitized received signals.

18. A modem as recited in claim 17, wherein the radio receiver and the modem receive signals conform to the IEEE 802.11a standard.

19. A modem as recited in claim 17, substantially implemented as a monolithic CMOS integrated circuit.

* * * * *

UNITED STATES PATENT AND TRADEMARK OFFICE
CERTIFICATE OF CORRECTION

PATENT NO.    : 6,486,820 B1
DATED         : November 26, 2002
INVENTOR(S)   : Allworth et al.

It is certified that error appears in the above-identified patent and that said Letters Patent is hereby corrected as shown below:

<u>Column 2,</u>
Line 41, replace "cascading" by -- cascoding --.

<u>Column 7,</u>
Line 51, replace "cascad-" by -- cascod- --.
Line 52, replace "cascading" by -- cascoding --.

Signed and Sealed this

Eighteenth Day of March, 2003

JAMES E. ROGAN
*Director of the United States Patent and Trademark Office*